(12) United States Patent
Hung

(10) Patent No.: US 8,710,596 B2
(45) Date of Patent: Apr. 29, 2014

(54) SEMICONDUCTOR DEVICE

(75) Inventor: Ching-Wen Hung, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/106,865

(22) Filed: May 13, 2011

(65) Prior Publication Data

US 2012/0286376 A1 Nov. 15, 2012

(51) Int. Cl.
*H01L 29/772* (2006.01)
*H01L 21/336* (2006.01)

(52) U.S. Cl.
USPC ............ 257/412; 257/E29.242; 257/E21.409

(58) Field of Classification Search
USPC ................. 257/401, 412, E29.242, E21.409
See application file for complete search history.

(56) References Cited

U.S. PATENT DOCUMENTS

| | | | |
|---|---|---|---|
| 5,998,873 A | 12/1999 | Blair | |
| 6,855,607 B2 | 2/2005 | Achuthan | |
| 6,897,114 B2 * | 5/2005 | Krueger et al. | 438/259 |
| 7,013,446 B2 | 3/2006 | Ohba | |
| 7,112,495 B2 | 9/2006 | Ko | |
| 7,214,620 B2 | 5/2007 | Kim | |
| 7,250,658 B2 | 7/2007 | Doris | |
| 7,402,496 B2 * | 7/2008 | Liu et al. | 438/300 |
| 7,521,324 B2 | 4/2009 | Ohmi | |
| 7,531,437 B2 * | 5/2009 | Brask et al. | 438/585 |
| 7,592,270 B2 | 9/2009 | Teo | |
| 7,633,127 B2 * | 12/2009 | Wen et al. | 257/384 |
| 8,236,637 B2 * | 8/2012 | Utomo et al. | 438/199 |
| 2007/0015365 A1 | 1/2007 | Chen | |
| 2007/0072376 A1 | 3/2007 | Chen | |
| 2007/0218661 A1 | 9/2007 | Shroff | |
| 2008/0006884 A1 * | 1/2008 | Yagishita | 257/384 |
| 2008/0061366 A1 | 3/2008 | Liu | |
| 2009/0057759 A1 | 3/2009 | Obradovic | |
| 2009/0124097 A1 | 5/2009 | Cheng | |
| 2009/0200494 A1 | 8/2009 | Hatem | |
| 2010/0040768 A1 | 2/2010 | Dhindsa | |
| 2010/0044783 A1 | 2/2010 | Chuang | |
| 2010/0048027 A1 | 2/2010 | Cheng | |
| 2010/0129994 A1 | 5/2010 | Awad | |
| 2013/0075826 A1 * | 3/2013 | Xu | 257/369 |

* cited by examiner

*Primary Examiner* — Matthew W Such
*Assistant Examiner* — Monica D Harrison
(74) *Attorney, Agent, or Firm* — Winston Hsu; Scott Margo

(57) ABSTRACT

A semiconductor device is disclosed. The semiconductor device includes: a substrate having a region; a gate structure disposed on the region of the substrate; a raised epitaxial layer disposed in the substrate adjacent to two sides of the gate structure, wherein the surface of the raised epitaxial layer is even with the surface of the gate structure.

5 Claims, 5 Drawing Sheets

SEMICONDUCTOR DEVICE

BACKGROUND OF THE INVENTION

1. Field of the Invention

The invention relates to a semiconductor device and method for fabricating the same, and more particularly, to a CMOS transistor and method for fabricating the same.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

It is an objective of the present invention to provide a process for fabricating CMOS device having dual work functional metal gates, which not only simplifies the complexity of current approach but also lowers the entire fabrication cost substantially.

According to a preferred embodiment of the present invention, a semiconductor device is disclosed. The semiconductor device includes: a substrate having a region; a gate structure disposed on the region of the substrate; a raised epitaxial layer disposed in the substrate adjacent to two sides of the gate structure, wherein the surface of the raised epitaxial layer is even with the surface of the gate structure.

It is another aspect of the present invention to provide a method for fabricating a semiconductor device. The method includes the steps of: providing a substrate having a region; forming a gate structure on the region of the substrate; forming a raised epitaxial layer in the substrate adjacent to two sides of the gate structure; covering a dielectric layer on the gate structure and the raised epitaxial layer; and using a planarizing process to partially remove the dielectric layer and the gate structure such that the surface of the gate structure is even with the surface of the raised epitaxial layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
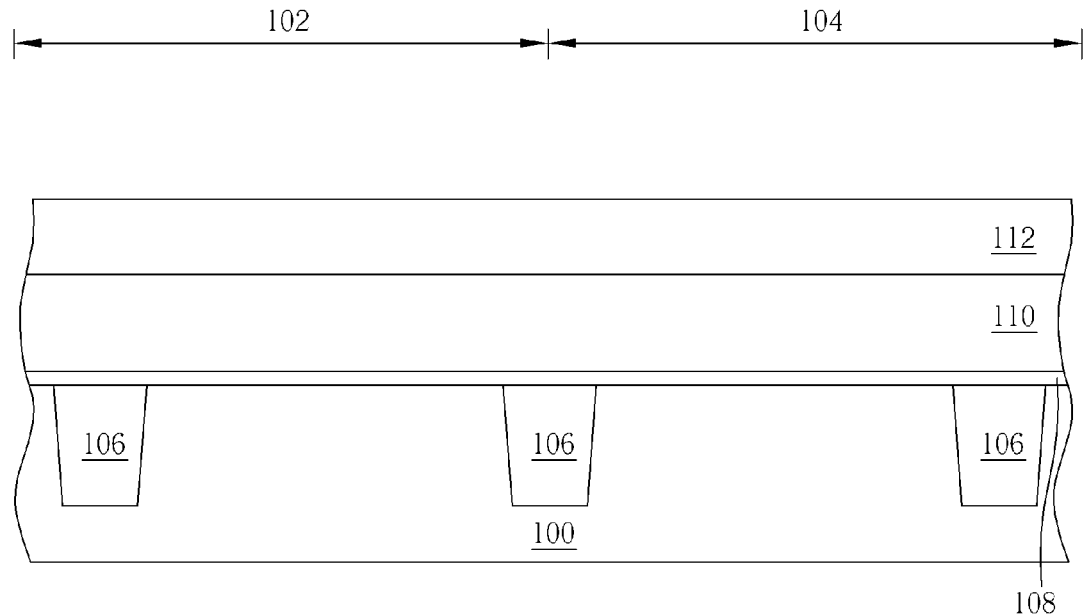
FIGS. 1-9 illustrate a method for fabricating a semiconductor device having metal gate according to a preferred embodiment of the present invention.

Referring to FIGS. 1-9, FIGS. 1-9 illustrate a method for fabricating a semiconductor device having metal gate according to a preferred embodiment of the present invention. In this embodiment, the semiconductor device is preferably a CMOS transistor, in which the method preferably utilizes a gate-last approach accompanying a high-k last fabrication. As shown in FIG. 1, a substrate 100, such as a silicon substrate or a silicon-on-insulator (SOI) substrate is provided. A first region and a second region are defined on the substrate 100, such as a PMOS region 102 and a NMOS region 104. A plurality of shallow trench isolations (STI) 106 are formed in the substrate 100 for separating the two transistor regions. It should be noted that even though a high-k last process is utilized in this embodiment, a high-k first process could also be employed according to the demand of the product.

Next, an interfacial layer 108 composed of oxide or nitride is formed on the surface of the substrate 100, and a film stack composed of a polysilicon layer 110 and a hard mask 112 is formed on the interfacial layer 104. Preferably, the polysilicon layer 110 is used as a sacrificial layer, which could be composed of undoped polysilicon, polysilicon having n+ dopants, or amorphous polysilicon material. The hard mask 112 could be composed of $SiO_2$, SiN, SiC, or SiON.

Figure 2:
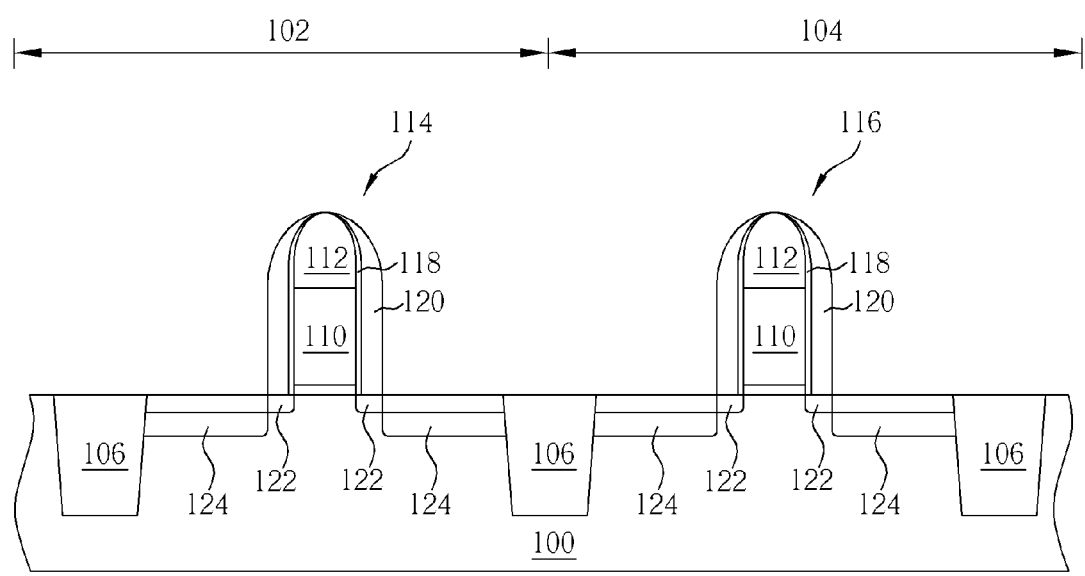

Next, as shown in FIG. 2, a patterned resist (not shown) is formed on the hard mask 112, and a pattern transfer is conducted by using the patterned resist as mask to partially remove the hard mask 112, the polysilicon layer 110, and the interfacial layer 108 through one or multiple etching processes. After stripping the patterned resist, a first gate structure 114 and a second gate structure 116 are formed on the PMOS region 102 and the NMOS region 104 respectively.

A first spacer 118 and a second spacer 120 are then formed on the sidewall of the first gate structure 114 and the second gate structure 116 respectively, and a lightly doped drain 122 and a source/drain 124 are formed in the substrate 100 adjacent to two sides of the first spacer 118 and the second spacer 120. It should be noted that even though the ion implantation for the source/drain region is conducted before the epitaxial layer, the source/drain region could also be formed after the epitaxial layer, which is also within the scope of the present invention.

Figure 3:
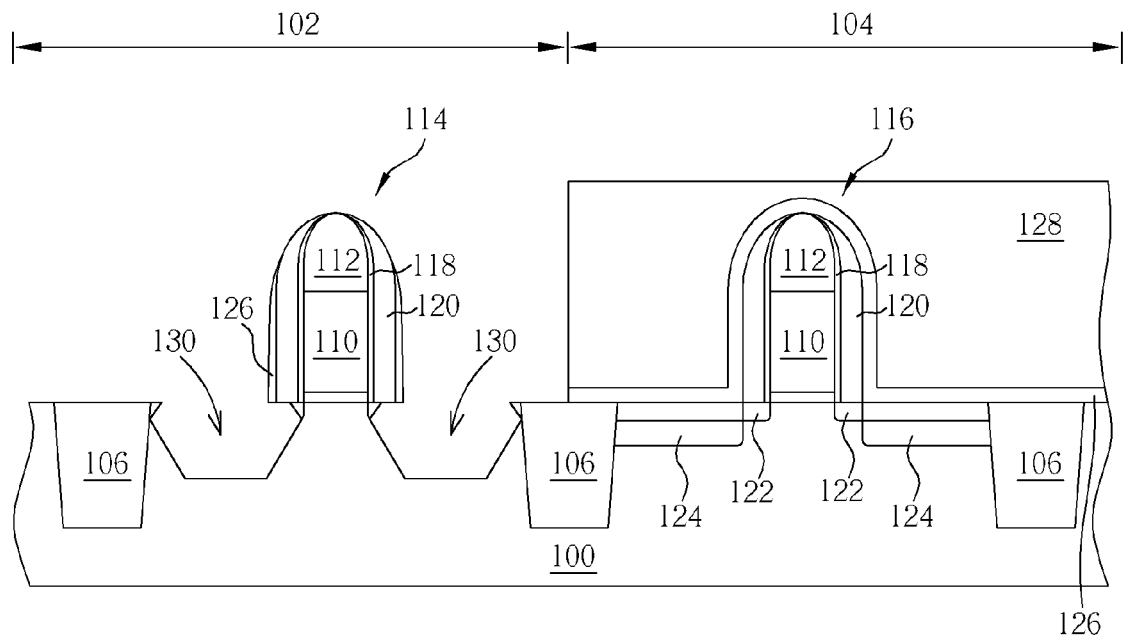

Next, as shown in FIG. 3, a first cap layer 126 is formed on the substrate 100 to cover the first gate structure 114 and the second gate structure 116. After a patterned resist 128 is covered on the NMOS region 104, a dry etching process and/or a wet etching process are carried out by using the patterned resist 128 as mask to partially remove the first cap layer 126 in the PMOS region 102 while forming a first recess 130 in the substrate 100 adjacent to two sides of the first gate structure 114. In this embodiment, the first cap layer 126 is preferably composed silicon nitride, the thickness of the first cap layer 126 is between 20-150 Angstroms and preferably at approximately 50 Angstroms, and the thickness of the first recess 130 is between 300-800 Angstroms and preferably at approximately 550 Angstroms.

Figure 4:
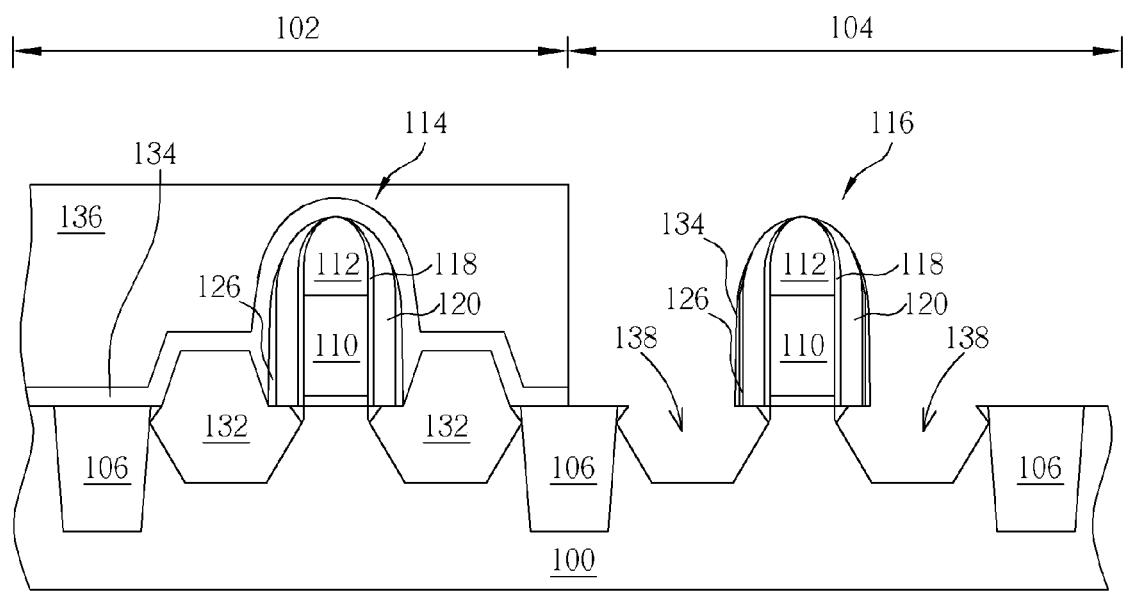

Next, as shown in FIG. 4, a selective epitaxial growth process is carried out after stripping the patterned resist 128 to form a first raised epitaxial layer 132 in the first recess 130. In this embodiment, the first raised epitaxial layer 132 preferably includes silicon germanium. The height of the epitaxial layer 132 under a typical 28 nm fabrication is preferably between 350 Angstroms to 400 Angstroms, whereas the height of the epitaxial layer 132 under a 20 nm fabrication is preferably less than 300 Angstroms. The epitaxial layer could be formed by following means: selective epitaxial growth process through single or multiple layer approach; SEG process accompanying in-situly doping with progression (such as the most bottom layer with no dopants at all, the first layer with slight dopant, the second layer with dopants of higher concentration, the third layer with dopants of high concentration . . . , and the top layer with no dopants at all or slight dopant concentration); alteration of the concentration of hetero atoms (such as the atom Ge in this case), in which the concentration thereof could be altered according to the constant and surface property of the lattice structure while the surface of the lattice would expect to have a lower concentration of Ge atoms or no Ge atoms at all to facilitate the formation of salicides afterwards.

Next, a second cap layer 134 is formed on the substrate of the substrate 100 to cover the first raised epitaxial layer 132, the first gate structure 114, and the second gate structure 116. Similar to the aforementioned first cap layer 126, the second cap layer 134 is also composed of silicon nitride, and the thickness thereof is between 20-150 Angstroms and preferably at approximately 50 Angstroms.

Next, a patterned resist 136 is formed on the PMOS region 102, and a dry etching process and/or a wet etching process are carried out by using the patterned resist 136 as mask to partially remove the second cap layer 134 in the NMOS region 104 while forming a second recess 138 in the substrate 100 adjacent to two sides of the second gate structure 116.

Figure 5:
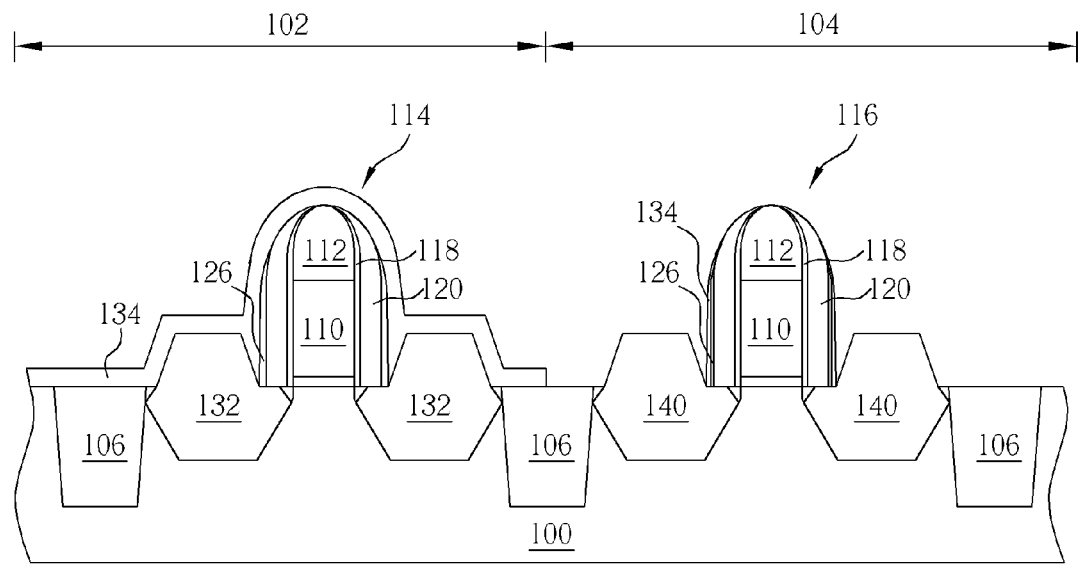

After stripping the patterned resist 136, as shown in FIG. 5, another selective epitaxial growth process is performed to form a second raised epitaxial layer 140 in the second recess 138. In this embodiment, the second raised epitaxial layer 140 preferably includes silicon carbide. The height of the second epitaxial layer 140 under a typical 28 nm fabrication is preferably between 350 Angstroms to 400 Angstroms, whereas the height of the epitaxial layer 140 under a 20 nm fabrication is preferably less than 300 Angstroms. Next, a laser anneal process is conducted by using high temperature to activate the dopants implanted into the substrate 100 previously for removing the lattice defect caused during the formation of epitaxial layer. Moreover, the order of forming the PMOS and NMOS could be reversed, and that the first and second cap layer could be selectively removed after the formation of epitaxial layer.

Figure 6:
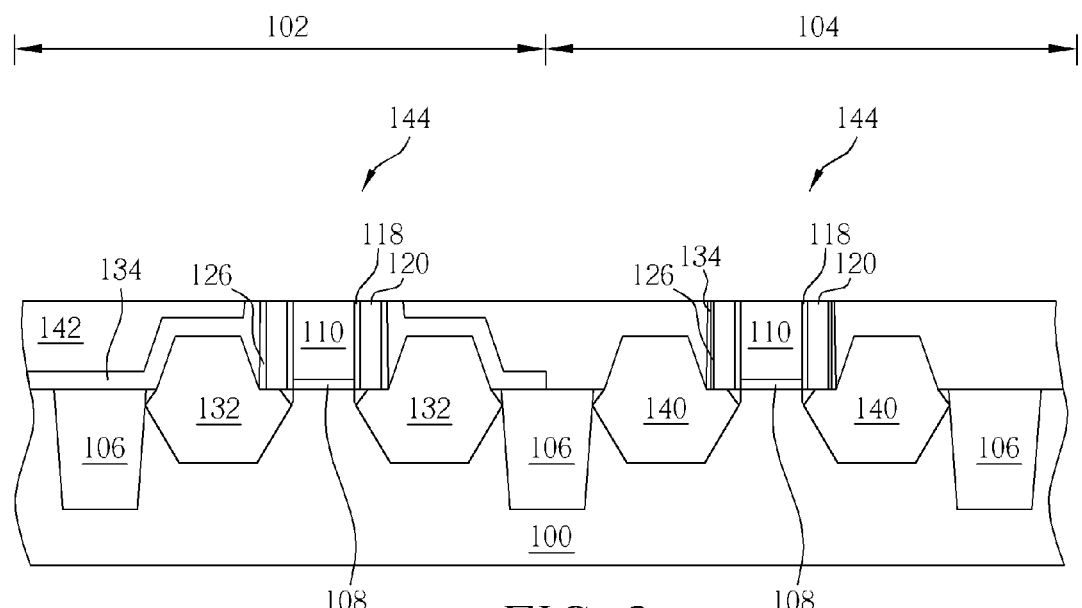

As shown in FIG. 6, an interlayer dielectric layer 142 is deposited on the surface of the substrate 100 to cover the PMOS region 102 and the NMOS region 104. In this embodiment, the interlayer dielectric layer 142 is preferably composed of silicon nitride, and the thickness thereof is between 1500-5000 Angstroms and preferably at about 3000 Angstroms.

Next, a planarizing process, such as a chemical mechanical polishing process is performed to partially remove the interlayer dielectric layer 142, the second cap layer 134 in the PMOS region 102, and stop on the polysilicon layer 110. Another etching process is then carried out to completely remove the polysilicon layer 110 in the PMOS region 102 and the NMOS region 104 to form a trench 144 in each region. It should be noted that even though the polysilicon layer in the two regions are removed simultaneously, the present invention could also remove the polysilicon layer of one of the two regions to form recess and deposit metal into the recess, and then remove the polysilicon layer of the other region and deposit metal afterwards.

Figure 7:
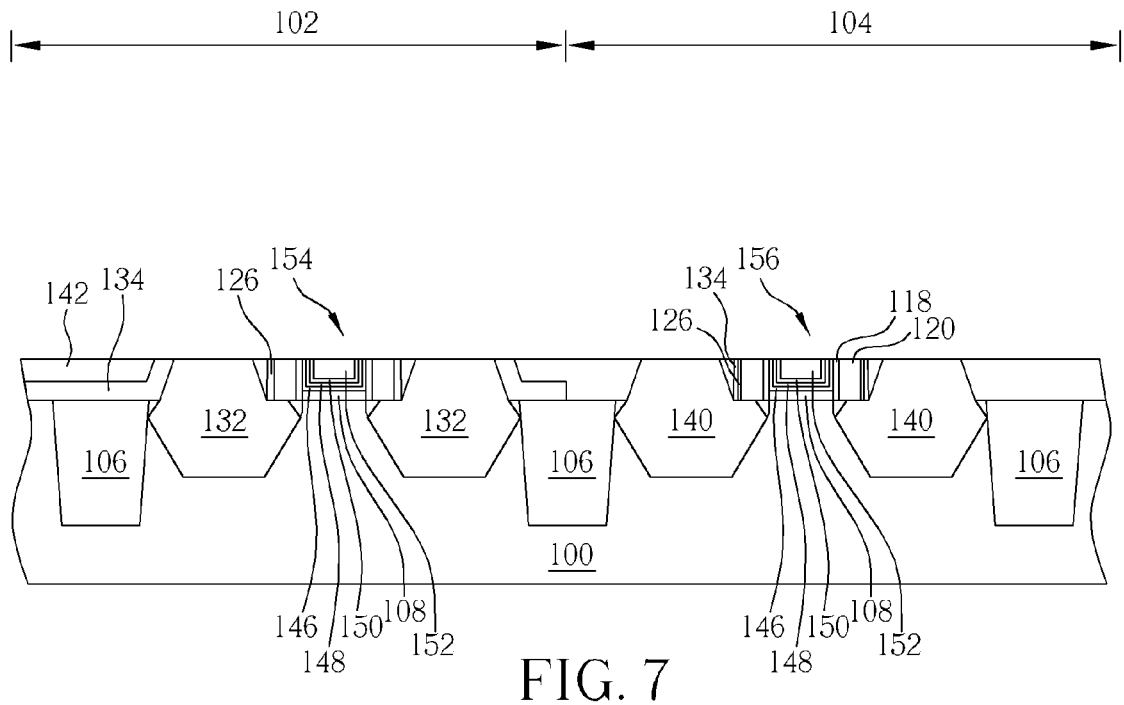

Next, as shown in FIG. 7, a high-k dielectric layer 146, a work function metal layer 148, a barrier layer 150, and a low resistance conductive layer 152 are sequentially deposited into the trench 144. One or more planarizing process, such as a chemical mechanical polishing process is performed to NMOS and/or PMOS to partially remove the low resistance conductive layer 152, the barrier layer 150, the work function metal layer 148, the high-k dielectric layer 146, the interlayer dielectric layer 142, and the second cap layer 134 until reaching the first raised epitaxial layer 132 and the second raised epitaxial layer 140 to form a first metal gate 154 and a second metal gate 156 in the PMOS region 102 and the NMOS region 104 respectively. As the first raised epitaxial layer 132 and the second raised epitaxial layer 140 are exposed through the above planarizing process, the surfaces of the first metal gate 154 and the second metal gate 156 are substantially even with the surfaces of the first raised epitaxial layer 132 and the second raised epitaxial layer 140. It should be noted that as the present invention pertains to a CMOS device having dual work function metal layers, the fabrication of the work function metal layer 148 for the p-type metal and n-type metal are preferably separated. As this approach is well known to those skilled in the art, the details of which is omitted herein for the sake of brevity. Moreover, the aforementioned layers formed in the N/P MOS region could be different according to the demand of the product.

In this embodiment, the high-k dielectric layer 146 could be a single-layer or a multi-layer structure containing metal oxide layer such as rare earth metal oxide, in which the dielectric constant of the high-k dielectric layer 146 is substantially greater than 20. For example, the high-k dielectric layer 146 could be selected from a group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

The work function metal layer 148, depending on the type of transistor could include either p-type metal or n-type metal, such as TiAl, ZrAl, WAl, TaAl, or HfAl, or TiN or TaC, but not limited thereto. The barrier layer 150 could include TiN, and the low resistance conductive layer 152 could include Al, Ti, Ta, W, Nb, Mo, Cu, TiN, TiC, TaN, Ti/W, or composite metal such as Ti/TiN, but not limited thereto.

Figure 8:
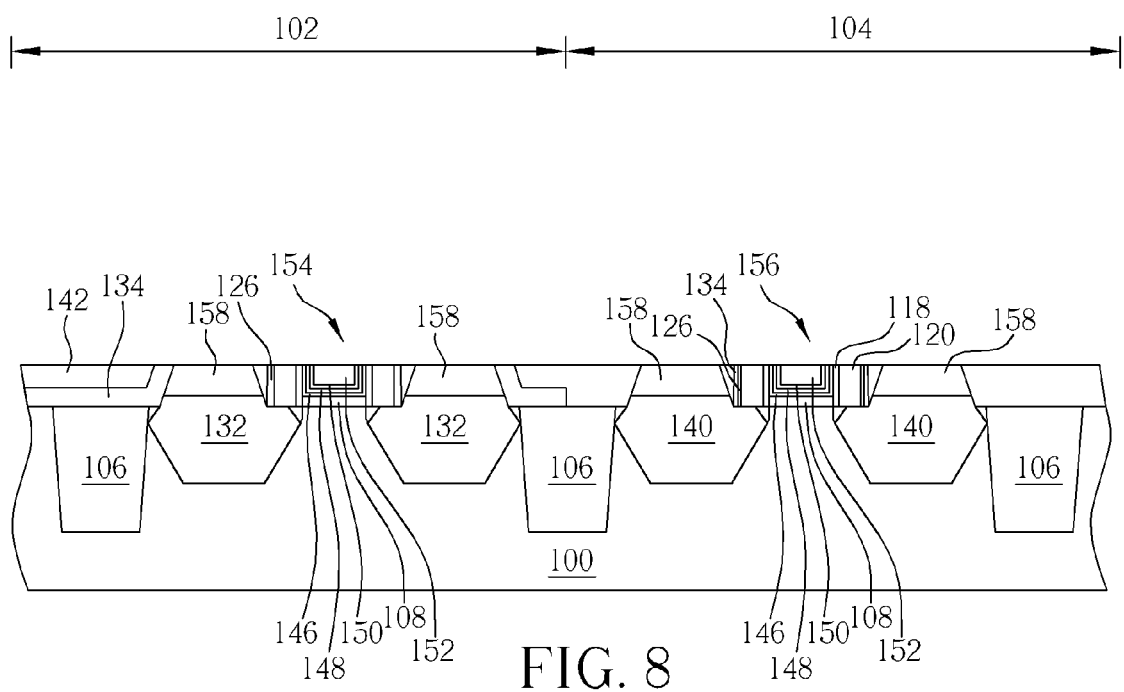

Next, as shown in FIG. 8, a salicide process is performed by first forming a metal selected from a group consisting of cobalt, titanium, nickel, platinum, palladium, and molybdenum on the first raised epitaxial layer 132, the first metal gate 154, the second raised epitaxial layer 140, and the second metal gate 156, and then using at least one rapid thermal anneal process to react the metal with epitaxial layer for forming a silicide layer 158 on the surface of the first raised epitaxial layer 132 and the second raised epitaxial layer 140. After removing un-reacted metal, the surface of the silicide layer 158 is preferably even with the surface of the first metal gate 154 and the second metal gate 156.

Figure 9:
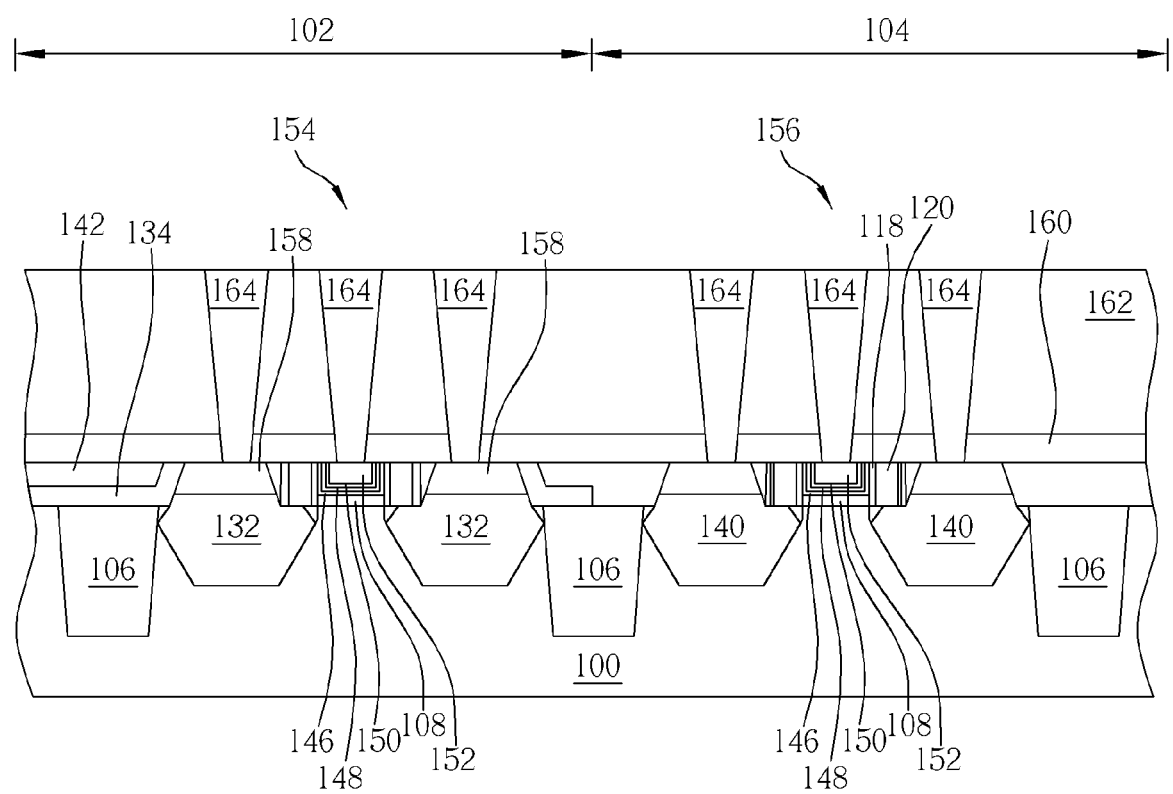

Next, as shown in FIG. 9, a nitrogen doped carbide (NDC) layer 160 is formed on the surface of the silicide layer 158, in which the NDC layer 160 could be used to prevent water vapor from entering the device. A dielectric layer 162 composed of silicon oxide is then deposited on the NDC layer 160, and an interconnective process is carried out to form a plurality of trenches (not shown) by etching a portion of the dielectric layer 162, and fill metal material such as copper into the trenches for forming an interconnective structure 164. This completes the fabrication of a semiconductor device according to a preferred embodiment of the present invention.

In addition to the aforementioned embodiment for fabricating metal gate transistor, the process of the present invention could also be applied to a polysilicon gate fabrication, which is also within the scope of the present invention. For instance, before removing the polysilicon material from the first gate structure and the second gate structure addressed above, a planarizing process could be carried out to planarize the surface of each polysilicon gate and the raised epitaxial layers adjacent to two sides of each polysilicon gate such that the surface of each polysilicon gate is even with the surfaces of the raised epitaxial layers. The aforementioned salicide process could then be conducted to form a silicide layer on the polysilicon gate and the raised epitaxial layers in each region.

Overall, the present invention first forms a raised epitaxial layer structure in each PMOS region and NMOS region of the substrate, and as a planarizing process is used to partially remove the gate structure for forming a polysilicon gate or metal gate, the raised epitaxial layers are also planarized such that the surfaces of the raised epitaxial layers are even with the surfaces of the gate structures. Subsequently, a silicide layer is formed directly on the exposed epitaxial layers. As the surface of the completed silicide is preferably even with the surface of the polysilicon gate or metal gate, the present invention could omit a typical contact plug fabrication and perform an interconnective process directly, thereby simplifying the complexity of current process and lowering the entire fabrication cost. Moreover, the salicide process for fabricating silicide layers and gate structures on an even surface of the present invention could also be applied to other semiconductor products, such as non-planar FETs including finFETs and tri-gate FETs, which are all within the scope of the present invention.

Those skilled in the art will readily observe that numerous modifications and alterations of the device and method may be made while retaining the teachings of the invention.

What is claimed is:

1. A semiconductor device, comprising:
a substrate having a PMOS region and a shallow trench isolation (STI);
a gate structure disposed on the PMOS region of the substrate, wherein the gate structure comprises a spacer;
a raised epitaxial layer disposed in the substrate adjacent to two sides of the gate structure, wherein the top surface of the raised epitaxial layer comprising silicon germanium is even with the top surface of the gate structure and the top surface of the spacer, and higher than the top surface of the STI; and
a cap layer on the STI, wherein the top surface of the cap layer is even with the top surface of the raised epitaxial layer.

2. The semiconductor device of claim 1, wherein the raised epitaxial layer comprises silicides.

3. The semiconductor device of claim 2, wherein the surface of the silicides is even with the surface of the gate structure.

4. The semiconductor device of claim 1, wherein the gate structure comprises a metal gate.

5. The semiconductor device of claim 1, wherein the gate structure comprises a polysilicon gate.

* * * * *